United States Patent
Chen

(10) Patent No.: US 6,781,055 B2
(45) Date of Patent: Aug. 24, 2004

(54) CIRCUIT BOARD MOUNTING DEVICE

(75) Inventor: Li Ping Chen, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/306,338

(22) Filed: Nov. 26, 2002

(65) Prior Publication Data

US 2003/0230429 A1 Dec. 18, 2003

(30) Foreign Application Priority Data

Jun. 13, 2002 (TW) .................................... 91208815 U

(51) Int. Cl.[7] .............................................. H05K 5/00
(52) U.S. Cl. ...................... 174/52.1; 361/752; 361/758; 439/76.1
(58) Field of Search ............................ 174/52.1, 35 R; 361/683, 753, 758, 742, 816, 818; 439/76.1, 95–97, 92

(56) References Cited

U.S. PATENT DOCUMENTS

| | | | | |
|---|---|---|---|---|
| 2,747,166 A | * | 5/1956 | Hoffarth | ..................... 439/884 |
| 4,495,380 A | * | 1/1985 | Ryan et al. | .............. 174/138 D |
| 4,760,495 A | * | 7/1988 | Till | .............................. 361/804 |
| 5,620,290 A | * | 4/1997 | Homfeldt et al. | ............ 411/533 |
| 5,833,480 A | * | 11/1998 | Austin | .......................... 439/95 |
| 6,535,394 B1 | * | 3/2003 | Hirzmann | .................... 361/761 |

* cited by examiner

Primary Examiner—Dean A. Reichard
Assistant Examiner—Carmelo Oliva
(74) Attorney, Agent, or Firm—Wei Te Chung

(57) ABSTRACT

A motherboard mounting device (100) includes a standoff (10) and an annular elastic clip (20), both of which are made of electrically conductive material. The standoff includes a head (12), a body (16), and a neck (14) between the head and the body. The clip is undulated, and defines a central opening (22). The clip has a plurality of radial upper and lower ridges (24, 26). The clip is mounted around the neck of the standoff. Several motherboard mounting devices are used to mount a motherboard (50) to a computer enclosure. The heads of the standoffs are extended through the motherboard, and the motherboard is pushed horizontally so it is sandwiched between the heads and the bodies. The motherboard is accordingly securely mounted to the enclosure. The upper ridges and the heads maintain good electrical contact with a grounding trace formed on both upper and lower surfaces of the motherboard.

16 Claims, 5 Drawing Sheets

CIRCUIT BOARD MOUNTING DEVICE

BACKGROUND OF THE INVENTION

1. Field of the Invention

The present invention relates to circuit board mounting devices, and more particularly to a motherboard mounting device which has a standoff and a clip between the standoff and an associated motherboard.

2. Description of Related Art

A motherboard is the foundation of electronic components used in a typical personal computer system. Firm and accurate mounting of the motherboard in the computer system is important for the computer system to operate properly and reliably. An enclosure of a computer system is typically made of metallic material. Solder portions of the motherboard cannot contact the enclosure, because this causes short circuiting of the motherboard. In general, some kind of supporting device is used to mount the motherboard to the enclosure while keeping the motherboard distanced from the enclosure.

Operating frequencies of modern electronic components on the motherboard are becoming higher and higher. A correspondingly large amount of static electricity is produced, which accumulates on the motherboard. The static electricity needs to be efficiently dissipated to ground, to avoid possible damage to sensitive electronic components on the motherboard. Accordingly, supporting devices should also function to provide electrical pathways from a grounding trace on the motherboard to a ground source such as the enclosure of the computer system.

U.S. Pat. No. 4,760,495 discloses one kind of motherboard supporting device. The supporting device is pillar-shaped. One end of the supporting device is mounted on the enclosure. An opposite end of the supporting device defines a screw hole aligned with a corresponding through hole defined in a motherboard. A screw is extended through the through hole of the motherboard to engage in the screw hole of the supporting device. Generally, a plurality of such supporting devices is required. Attaching the plurality of corresponding screws to mount the motherboard on the supporting devices is unduly inconvenient and time-consuming.

Another kind of supporting device is disclosed in China patent application no. 99216650.0. The supporting device is pillar-shaped, and is made of elastically deformable and electrically conductive material. One end of the supporting device is mounted on the enclosure. An opposite end of the supporting device has a head. A center of the head is hollow, and several through grooves are defined in the head. An upper end of the head is wider than a diameter of a corresponding hole defined in a motherboard. The head is deformably pushed through the hole of the motherboard. The motherboard is thus mounted on the enclosure by a plurality of the supporting devices. However, the motherboard is typically subjected to vibration and shock during normal use. After time, the heads of the supporting devices are liable to weaken. When this happens, the motherboard may become loosened or even disengaged from some of the supporting devices. In addition, such loosening or disengagement adversely affects any electrical connection that is provided between the heads and a grounding trace on the motherboard. Grounding pathways from the motherboard to the enclosure are diminished or lost.

SUMMARY OF THE INVENTION

Accordingly, an object of the present invention is to provide a motherboard mounting device which firmly mounts a motherboard in an enclosure.

Another object of the present invention is to provide a motherboard mounting device which provides good grounding for a motherboard.

In order to achieve the objects set out above, a motherboard mounting device of the present invention includes a standoff and a generally annular elastic clip, both of which are made of electrically conductive material. The standoff includes a head, a body, and a neck between the head and the body. The clip is undulated, and defines a central opening therein. The clip has a plurality of evenly-spaced radial upper ridges, and a plurality of evenly-spaced radial lower ridges. The clip is mounted around the neck of the standoff. A plurality of the motherboard mounting devices is used to mount a motherboard to a computer enclosure. The heads of the standoffs are extended through holes of the motherboard, and the motherboard is pushed horizontally so it is sandwiched between the heads and the bodies of the clips. The motherboard is accordingly securely mounted to the enclosure. Furthermore, the upper ridges of the clips and the heads of the standoffs maintain good electrical contact with a grounding trace formed on both upper and lower surfaces of the motherboard.

Other objects, advantages and novel features of the present invention will become more apparent from the following detailed description when taken in conjunction with the accompanying drawings, in which:

DETAILED DESCRIPTION OF THE INVENTION

Figure 1:
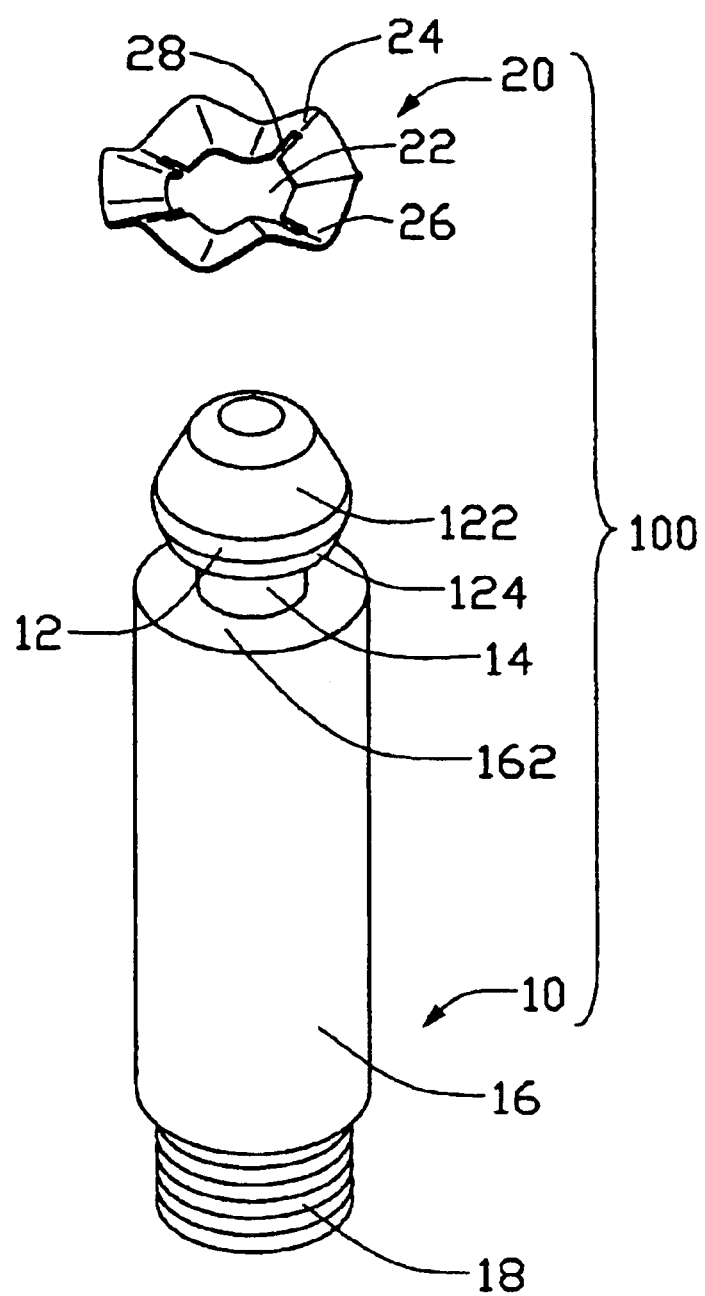
FIG. 1 is an exploded isometric view of a motherboard mounting device in accordance with a preferred embodiment of the present invention.

Reference will now be made to the drawing figures to describe preferred embodiments of the present invention in detail.

Figure 2:
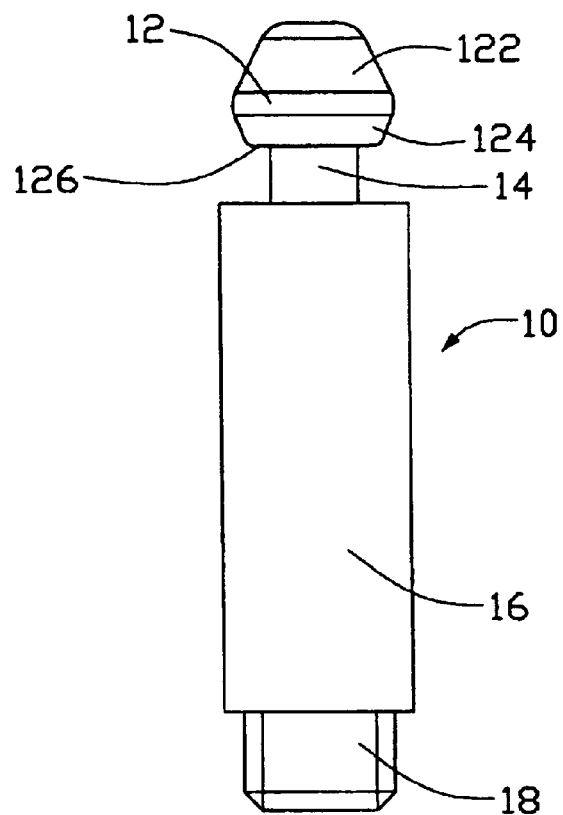
FIG. 2 is a side plan view of a standoff of the motherboard mounting device of FIG. 1.

Referring to FIGS. 1–2, a motherboard mounting device 100 in accordance with a preferred embodiment of the present invention includes a standoff 10 and an elastic clip 20. The standoff 10 is made of electrically conductive material and includes a top head 12, a cylindrical intermediate body 16, a cylindrical bottom mounting portion 18, and a cylindrical narrowed neck 14 between the head 12 and the body 16. The head 12 is generally spherical, and includes a generally hemispherical upper first guiding portion 122, and a generally hemispherical lower second guiding portion 124.

A junction of the first and second guiding portions 122, 124 has a largest cross-section of the head 12. An annular pressing surface 126 is defined at a bottom of the second guiding portion 124 at the neck 14. A diameter of the neck 14 is less than a largest diameter of the pressing surface 126. A length of the neck 14 is substantially equal to a thickness of a motherboard 50 (see FIG. 5). A diameter of the body 16 is greater than the diameter of the neck 14. An annular support surface 162 is defined at a top of the body 16 at the neck 14. Thus a toroidal space (not labeled) is defined between the second guiding portion 124 and the support surface 162, for engagingly receiving a corresponding part of the motherboard 50 therein. A mounting portion 18 depends from a bottom of the body 16. The mounting portion 18 is threaded so that it can be engaged in a computer enclosure (not labeled, see FIG. 5).

Figure 3:
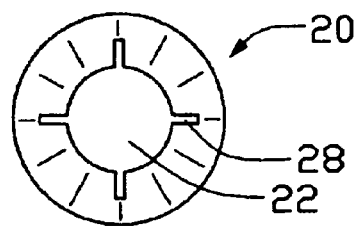
FIG. 3 is a top plan view of a clip of the motherboard mounting device of FIG. 1.
Figure 4:
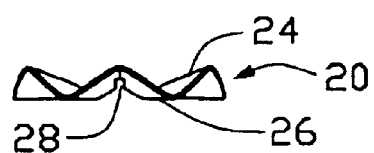
FIG. 4 is an side plan view of the clip of the motherboard mounting device of FIG. 1.

Referring also to FIGS. 3 and 4, the clip 20 is made of metallic material having good elasticity and electrical conductivity, such as beryllium-copper alloy. The clip 20 is generally annular, and defines an opening 22 in a center thereof. A diameter of the opening 22 is slightly less than a diameter of the largest cross-section of the head 12 of the standoff 10. When viewed from a side elevation, the clip 20 is undulated, and comprises a plurality of lower radial ridges 26 and upper radial ridges 24 arranged in alternating sequence around the center of the clip 20. The lower ridges 26 are substantially coplanar with each other. Each upper ridge 24 slants gently downwardly from a periphery of the clip 20 to the central opening 22. A plurality of evenly spaced radial grooves 28 is defined in an inmost portion of the clip 20 that surrounds the opening 22. Each groove 28 is in communication with the opening 22. The grooves 28 enhance elastic deformability of the clip 20.

Figure 5:
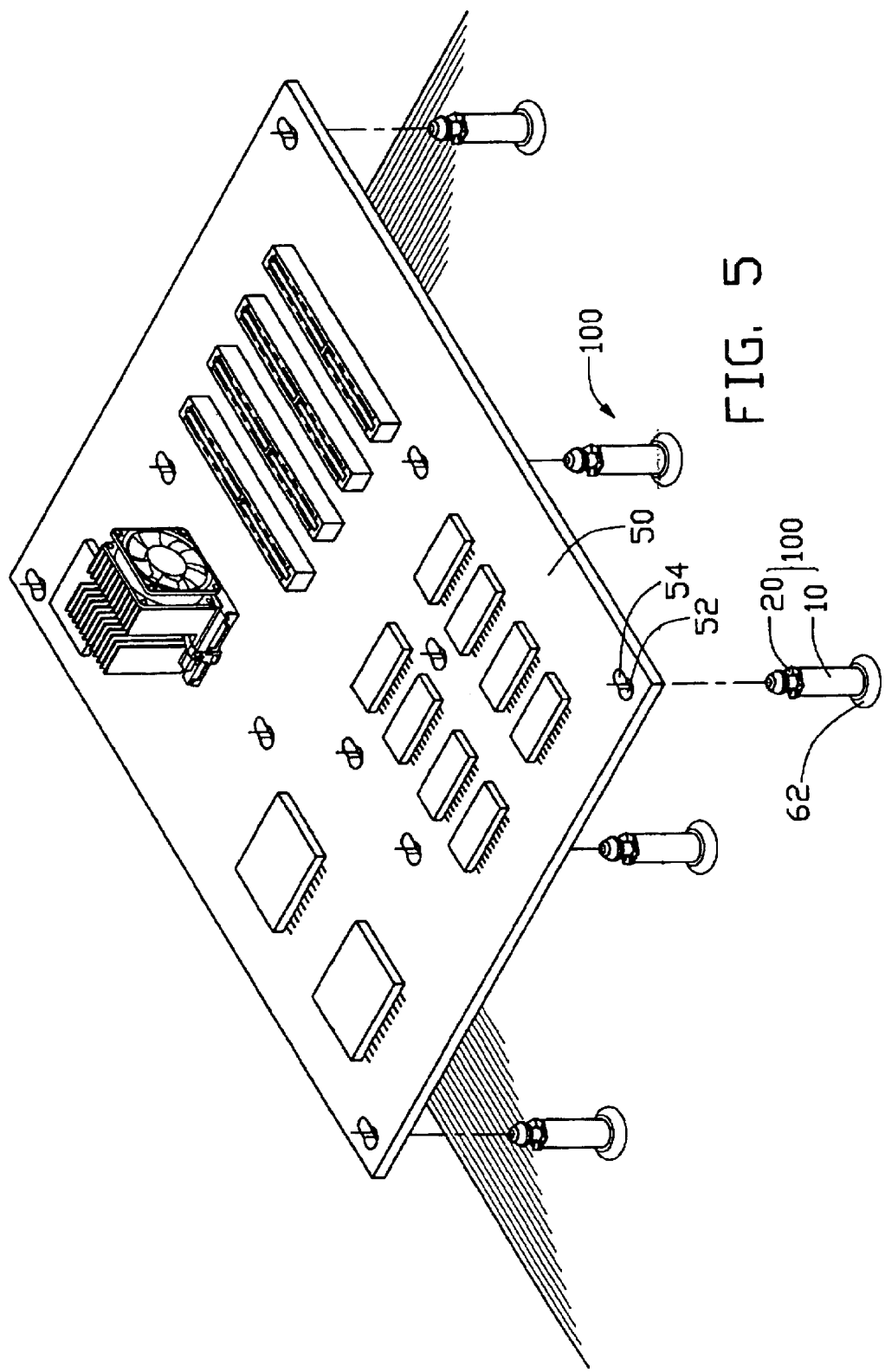
FIG. 5 is an exploded isometric view of a motherboard and a plurality of the motherboard mounting devices of FIG. 1 attached to a plurality of protrusions of a computer enclosure.

Referring also to FIG. 5, the motherboard 50 defines a plurality of mounting holes 51 therein. Each mounting hole 51 comprises a circular portion 52, and an adjacent slot portion 54 in communication with the circular portion 52. A diameter of the circular portion 52 is slightly larger than the diameter of the largest cross-section of the head 12 of the standoff 10. A width of the slot portion 54 is substantially the same as the diameter of the neck 14 of the standoff 10. A grounding trace is formed on both upper and lower surfaces of the motherboard 50, and surrounds each mounting hole 51. The computer enclosure forms a plurality of the generally annular protrusions 62. Positions of the protrusions 62 correspond to positions of the mounting holes 51 of the motherboard 50. Each protrusion 62 defines a screw hole (not visible).

Figure 6:
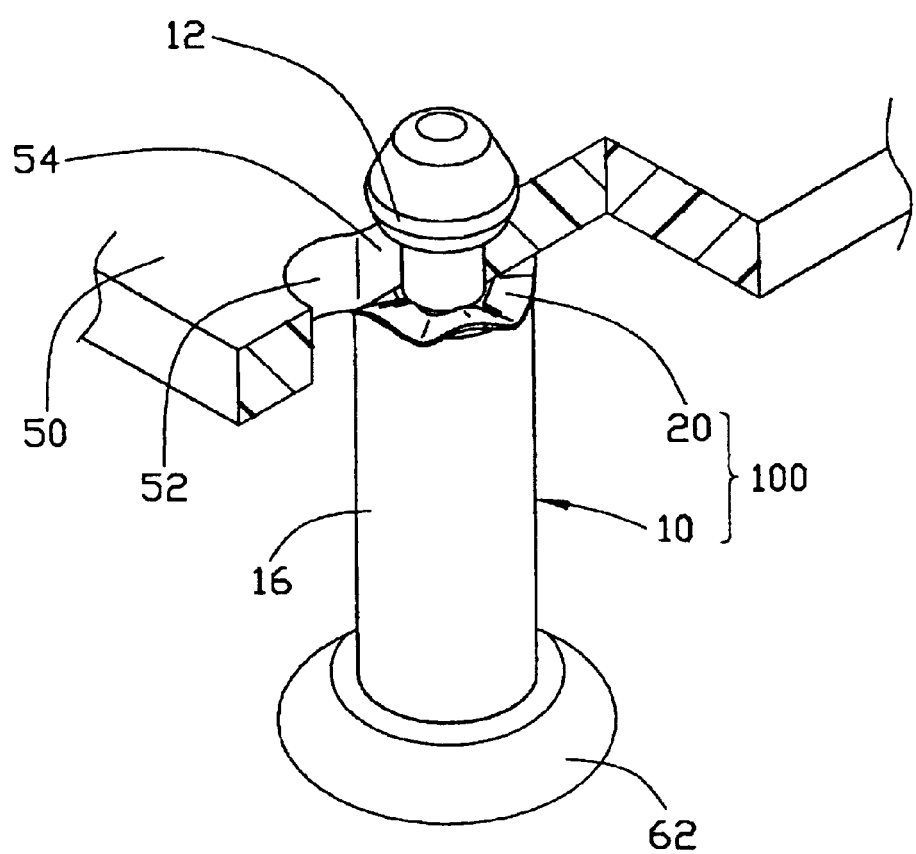
FIG. 6 is an enlarged cut-away isometric view of one of the motherboard mounting devices of FIG. 5 attached to the motherboard.

Referring also to FIG. 6, when mounting the motherboard 50 to the computer enclosure, a plurality of motherboard mounting devices 100 are used. The standoffs 10 are screwed into the corresponding screw holes of the protrusions 62 of the computer enclosure. Each clip 20 is put on the head 12 of its corresponding standoff 10, and pressed downwardly. This causes the clip 20 to resiliently deform and make the opening 22 large enough for the clip 20 to pass over the head 12. Thus the clip 20 resilienty rides over the head 12 to surround the neck 14. The lower ridges 26 of the clip 20 rest on the support surface 162 of standoff 10. In the same way, all the other clips 20 are mounted to their corresponding standoffs 10. The motherboard 50 is placed on the standoffs 10, with the circular portions 52 of the motherboard 50 aligned with the heads 12 of the standoffs 10. The motherboard 50 is pressed downwardly to cause the heads 12 to extend through the circular portions 52. The necks 14 of the standoffs 10 are thus received in the circular portions 52, with the second guiding portions 124 of the standoffs 10 being located partly in the circular portions 52. The motherboard 50 is then pushed horizontally. The necks 14 of the standoffs 10 are thus received in the slot portions 54 of the motherboard 50. The upper ridges 24 of the clips 20 resiliently abut the lower surface of the motherboard 50, and the heads 12 accordingly firmly abut the upper surface of the motherboard 50. The motherboard 50 is thus sandwiched between the heads 12 and the bodies 16 of the clips 20, and is accordingly securely mounted to the computer enclosure. Furthermore, the upper ridges 24 of the clips 20 and the second guiding portions 124 of the standoffs 10 maintain good electrical contact with the grounding trace of the motherboard 50.

In disassembly, the motherboard 50 is pushed horizontally to cause the necks 14 to exit the slot portions 54 and enter the circular portions 52. The motherboard 50 is then easily removed from the standoffs 10.

Figure 7:
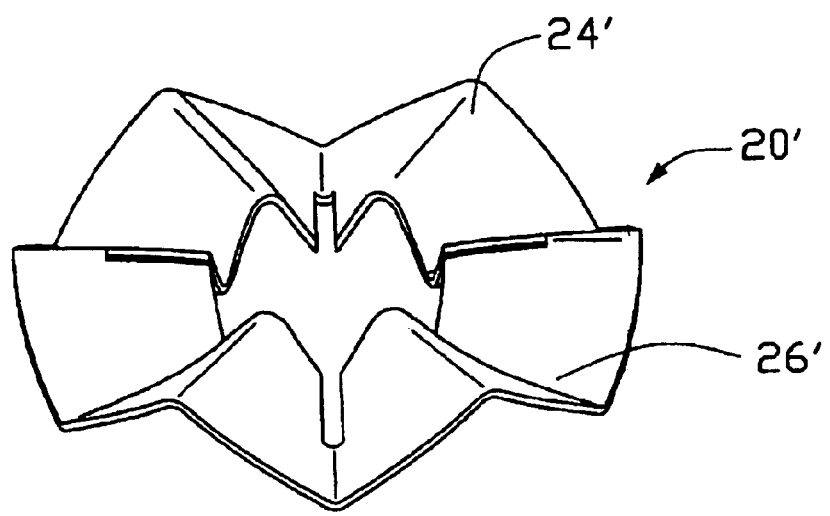
FIG. 7 is an enlarged isometric view of a clip of a motherboard mounting device in accordance with an alternative embodiment of the present invention.
Figure 8:
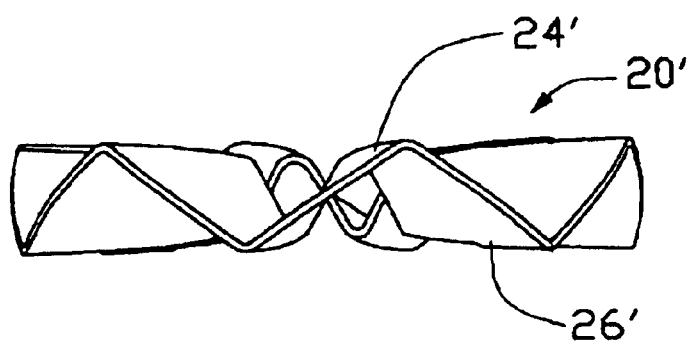
FIG. 8 is a side plan view of the clip of FIG. 7.

FIGS. 7 and 8 show a clip 20' in accordance with an alternative embodiment of the present invention. When viewed from a side elevation, the clip 20' is undulated, and comprises a plurality of lower radial ridges 26' and upper radial ridges 24' arranged in alternating sequence around a center of the clip 20'. The upper ridges 24' are substantially coplanar with each other. The lower ridges 26' are substantially coplanar with each other. Assembly using a plurality of the clips 20' is substantially the same as the above-described assembly using the clips 20 of the preferred embodiment. When the upper ridges 24' resiliently abut the lower surface of the motherboard 50, the upper ridges 24' apply uniform pressure on the motherboard 50 along their respective lengths.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting device adapted to mount a circuit board to a computer enclosure, the mounting device comprising:
   a standoff comprising a head, a body and a neck connecting between the head and the body; and
   an undulated clip surrounding the neck, the clip defining an opening for extension of the head therethrough, the clip having a plurality of upper ridges and lower ridges surrounding the opening for pressing and electrically contacting the circuit board.

2. The mounting device recited in claim 1, wherein the standoff and clip are made of electrically conductive material.

3. The mounting device recited in claim 2, wherein the head is generally hemispherical, and the neck and the body are cylindrical.

4. The mounting device recited in claim 2, wherein the head comprises a distal generally hemispherical first guiding portion, and a proximal generally hemispherical second guiding portion.

5. The mounting device recited in claim 4, wherein the second guiding portion has an annular surface for pressing the circuit board.

6. The mounting device recited in claim 1, wherein a diameter of the neck is less than a diameter of the head and a diameter body respectively.

7. The mounting device recited in claim 1, wherein the body of the standoff has a support surface at the neck supporting the clip.

8. The mounting device recited in claim 1, wherein the standoff further comprises a mounting portion for engaging with the computer enclosure.

9. The mounting device recited in claim 1, wherein the upper ridges slant downwardly from a periphery of the clip to the opening of the clip, and the lower ridges are substantially coplanar with each other.

10. The mounting device recited in claim 1, wherein the upper ridges are substantially coplanar with each other, and the lower ridges are substantially coplanar with each other.

11. The mounting device recited in claim 1, wherein the clip defines a plurality of grooves in communication with the opening for enhancing elastic deformability thereof.

12. A mounting device assembly comprising:
   a circuit board defining a mounting hole comprising a through portion and a locking portion; and
   a mounting device comprising:
      a standoff comprising a head, a body and a neck connecting between the head and the body, and
      an undulated clip surrounding the neck,
      wherein the standoff is extendable through the through portion of the mounting hole and engagable in the looking portion of the mounting hole with the circuit board being sandwiched between the head of the standoff and the clip.

13. The mounting device assembly recited in claim 12, wherein the standoff and clip are made of electrically conductive material.

14. The circuit board mounting device recited in claim 12, wherein at least one grounding trace is formed on the circuit board and surrounds the mounting hole, and at least one of the head of the standoff and the clip electrically contacts the at least one grounding trace.

15. A mounting device assembly comprising:
   a printed circuit board defining a plurality of mounting holes each with a large section and a small section; and
   a mounting device including:
      a plurality of standoffs each defining a narrowed neck between a head and a body, the neck being not diametrically larger than the small section, and the head being diametrically larger than the small section while smaller than the large section;
      a clip restrictively supported by the body, said clip being compressible along an axial direction of said standoff; wherein
      the head of the standoff vertically extends through the large section of the corresponding mounting hole of the printed circuit board with an extent and moves horizontally to the small section where the clip is compressed to allow the head to downwardly abut against the printed circuit board.

16. The assembly recited in claim 15, wherein said clip is diametrically larger than the large section.

\* \* \* \* \*